United States Patent [19]
Pulfrey et al.

[11] Patent Number: 5,285,083
[45] Date of Patent: Feb. 8, 1994

[54] INVERTED HETEROJUNCTION BIPOLAR DEVICE HAVING UNDOPED AMORPHOUS SILICON LAYER

[75] Inventors: David L. Pulfrey; David D. Shulman, both of Vancouver, Canada; Vladimir Samuilov, Byelorus, U.S.S.R.; Elena Bondarionok, Byelorus, U.S.S.R.; Vasilii Krasnitski, Byelorus, U.S.S.R.; Nickolai Poklonski, Byelorus, U.S.S.R.; Viatcheslav Stelmakh, Byelorus, U.S.S.R.

[73] Assignee: The University of British Columbia, Vancouver, Canada

[21] Appl. No.: 874,467

[22] Filed: Apr. 27, 1992

[51] Int. Cl.$^5$ .......................................... H01L 29/161
[52] U.S. Cl. ........................... 257/52; 257/49; 257/12; 257/51
[58] Field of Search ................ 357/34; 257/49, 52

[56] References Cited

U.S. PATENT DOCUMENTS 4,062,034 12/1977 Matsushita et al. .................. 257/52
4,414,557 11/1983 Amemiya et al. .................... 257/49

Primary Examiner—Joseph A. Popek
Assistant Examiner—Viet Q. Nguyen
Attorney, Agent, or Firm—Barrigar & Oyen

[57] ABSTRACT

A heterojunction bipolar transistor having base, emitter and undoped amorphous silicon collector regions formed on a crystalline silicon substrate. A p-n junction is formed in the substrate, beneath the collector region. A single such transistor may be configured as a static memory device which may be reversibly switched between stable first and second states by applying a voltage of about 8 to 10 volts to the collector and by selectively applying positive or negative pulses of about ±0.75 volts to the base.

4 Claims, 3 Drawing Sheets

INVERTED HETEROJUNCTION BIPOLAR DEVICE HAVING UNDOPED AMORPHOUS SILICON LAYER

FIELD OF THE INVENTION

This application is directed to an inverted heterojunction bipolar device having an undoped amorphous silicon/crystalline silicon ("a—Si/c—Si") structure; and, to a static memory cell based upon a single such device which may be easily controlled to exhibit rapid, reversible switching between two stable states.

BACKGROUND OF THE INVENTION

Heterojunction devices are formed by combining two different semiconductor materials such as crystalline silicon and amorphous silicon. Amorphous silicon is a desirable material to employ because it can be biased to exhibit two distinct states which differ by several orders of magnitude; namely, an "off" state characterized by very low electrical current conductivity, and an "on" state characterized by comparatively high electrical current conductivity. By appropriately controlling the biasing of such material, in the pulsed regime, one may selectively switch the material back and forth between the two states. Controllable, reversible switching between distinct, stable states is a basic requirement of memory cells of the type used in computer memory applications.

The prior art reveals the use of doped amorphous silicon in heterojunction devices such as bipolar transistors which exhibit high current gain: Symons, et al, "Silicon Heterojunction Bipolar Transistors With Amorphous and Microcrystalline Emitters", Solid-State Electronics 30, p. 1143 (1987); and, in solar cells: Carlson, "Amorphous Solar Cells", IEEE Transactions on Electron Devices ED-24,p. 449 (1977). Amorphous silicon heterojunction devices such as electrically programmable read only memories ("EPROM"s) which exhibit irreversible switching behaviour are known: Shacham-Diamond, et al "The Electrical Properties of Ion-Implanted Amorphous Silicon Programmable Element in the Unprogrammed State", IEEE Transactions on Electron Devices ED-37, p. 159 (1990). Two-terminal doped amorphous silicon heterojunction devices capable of exhibiting dynamic, reversible switching behaviour are also known: Chen, et al, "Electrical and Optical Characteristics of an a—Si:H/c—Si Heterojunction Switch", Japanese Journal of Applied Physics 29, p. 1415 (1990). Chen et al have also reported three-terminal devices incorporating amorphous silicon, but have reported investigation of switching behaviour only in respect of two-terminal devices.

The present invention facilitates the fabrication of three-terminal heterojunction bipolar structures utilizing undoped amorphous silicon. A single structure of this type has been found to exhibit static switching behaviour. That is, the structure can be controllably switched between the two conductivity states aforesaid; and, when controllably switched to a particular state, remains in that state until controllably switched to the other state. Conventional static memory devices comprise several inter-coupled transistor structures. The invention accordingly facilitates simplified construction of static memory devices which are less complex than prior art static memory devices.

SUMMARY OF THE INVENTION

In accordance with the preferred embodiment, the invention provides a heterojunction bipolar transistor in which a base region, an emitter region, and an undoped amorphous silicon collector region are formed on a crystalline silicon substrate. A p-n junction is formed in the substrate, beneath the collector region. Advantageously, the base region is p type crystalline silicon, and the emitter region is n type crystalline silicon.

The invention further provides a memory device which may be reversibly switched between stable first and second states, the device comprising a single heterojunction bipolar transistor as set forth above. A collector supply voltage means is provided, to apply a voltage of about 8 to 10 volts to the collector. A pulse switching means is also provided to selectively apply positive or negative voltage pulses to the base, thereby controllably switching the device between the first and second states respectively. Preferably, in this configuration, the positive voltage pulses have a magnitude greater than about 0.75 volts, and the negative voltage pulses have a magnitude less than about $-0.75$ volts.

DETAILED DESCRIPTION OF THE PREFERRED EMBODIMENT

Figure 1:
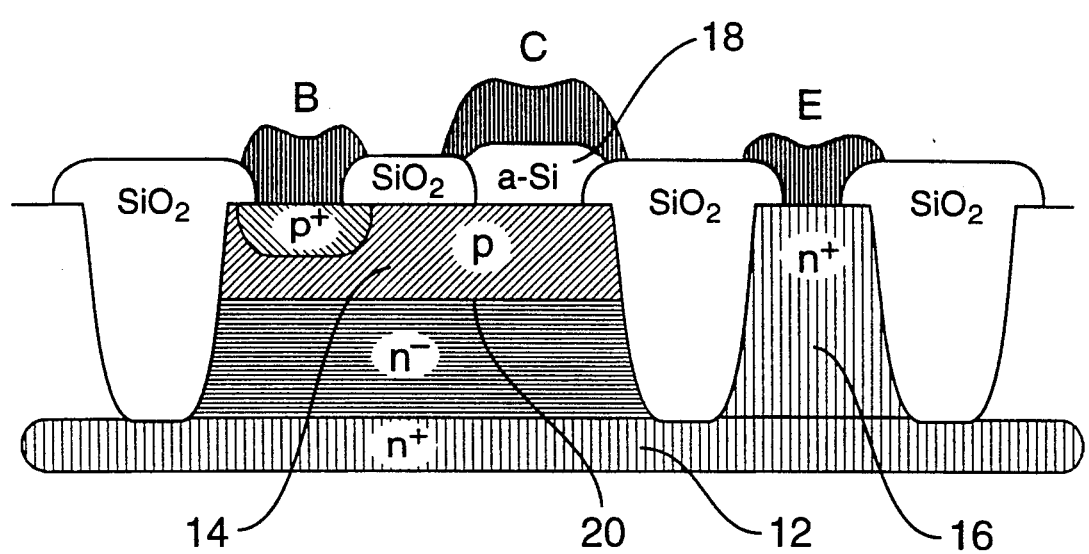
FIG. 1 is a schematic cross section of an inverted heterojunction bipolar transistor fabricated in accordance with the preferred embodiment of the invention.

FIG. 1 depicts an inverted heterojunction bipolar transistor 10 formed on an $n$ type crystalline (c—Si) silicon substrate 12. A base region 14 of $p$ type crystalline silicon, and an emitter region 16 of $n^+$type crystalline silicon are formed in substrate 12. A collector region 18 of undoped amorphous silicon (a—Si) is formed on substrate 12 as hereinafter explained. A p-n junction 20 is formed in substrate 12, beneath collector region 18. Metallized contacts "B", "C" and "E" are provided atop base region 14, collector region 18 and emitter region 16 respectively. Normally, $n^+$region 16 would serve as a collector, and region 18 would serve as an emitter. However, in this case, transistor 10 operates in the reverse or inverted mode, in that the collector and emitter terminals are interchanged. This mode of operation allows control of the switching behaviour of the device by applying various biasing voltages to the undoped a—Si collector.

Transistor 10 is fabricated using a standard bipolar process. After the formation of a buried layer, an epitaxial $n$ layer (1.5 82 m, 1Ωcm) is grown. This is followed by two boron ion implantations, the first at 100 keV with a dose of $5 \times 10^{13}$ions/cm$^2$ and the second at 30 keV with a dose of $\approx 1.9 \times 10^{15}$ions/cm$^2$, to create, respectively, an $\approx 0.4$ µm thick $p$ type base region 14 and its contact. Undoped a—Si layers (≈ 0.5 μm) are then deposited by SiH₄ low pressure chemical vapour deposition onto the c—Si (p-n) structures to form a collector region 18 of about 10×10 μm². The temperature of substrate 12 is maintained at 550° centigrade. Care should be taken to avoid the formation of an interfacial oxide layer between the deposited a—Si collector region 18 and base region 14. Finally, aluminum ("Al") is vacuum deposited onto a—Si collector region 18, c—Si (p) base region 14 and c—Si (n) emitter region 16 and heated using rapid thermal annealing at about 300 to 350° centigrade for about 20 seconds to form the ohmic B, C and E contacts.

For pulsed operation, base terminal B of the common-emitter a—Si/c—Si transistor 10 was connected through a 1.8kΩ biasing resistor to a Tektronix TM type 115 pulse generator and collector terminal C was connected directly to a Hewlett Packard TM 54600A oscilloscope and through a 1 kΩ load resistor to a dc voltage supply. Base region 14 was then triggered with positive and negative voltage pulses in excess of 0.75 volts applied through the biasing resistor. For collector supply voltages less than 7 volts, transistor 10 remained in the "off" state and would not switch to the "on" state. For collector supply voltages between 7 and 8 volts, switching did occur, but transistor 10 remained in the new "on" state only for about 100 nanoseconds. However, for collector supply voltages between 8 and 10 volts, transistor 10 performed "off" → "on" and "on" → "off" transitions for positive and negative base-emitter voltage pulses respectively, and remains in the corresponding new state until the arrival of a new trigger pulse, as shown in FIG. 2.

The switching response did not depend on the pulse repetition rate, but the transition switching time did depend on the magnitude of the applied pulse. The rise time was about 40 nanoseconds for a positive $V_{BE}$ pulse of 1.7 volts and the fall time was about 200 nanoseconds for a negative pulse of $-1.7$ volts. Manual pulse measurements indicate that transistor 10 remained in the new "on" or "off" state for as long as the appropriate collector supply voltage was maintained. The structure in the "on" state returned to the original "off" state upon decreasing the collector supply voltage to less than about 8 volts. In pulsed operation at collector supply voltages between 8 and 10 volts, no permanent states were formed and it was always possible to switch between the "off" and "on" states either by pulsing $V_{BE}$ or by changing the collector supply voltage. However, for collector supply voltages in excess of 10 volts, the "on" state was transformed into the "off" state only by decreasing the collector supply voltage.

Quasi-static measurements were made using a Hewlett Packard TM 4145A semiconductor parameter analyzer ("SPA"). Typical collector-emitter I-V characteristics are depicted in FIG. 3 and show two distinct states when the base is positively biased with respect to the emitter. The initial "off" state is characterized by a high resistance at low applied collector-emitter voltages. Transistor 10 switches to the "on" state when, upon increasing the applied collector-emitter voltage, a certain threshold is reached. This threshold is reduced with increasing $V_{BE}$. In the "on" state the collector current is limited by the SPA current limiter. The I-V characteristics exhibit hysteresis: once the "on" state is reached, decreasing the collector-emitter voltage results in the "on" → "off" transition occurring at different values of $V_{CE}$. Although not shown in FIG. 3, it is noteworthy that for $V_{BE}$ less than 0.75 volts, the base current is negative, while for higher values of $V_{BE}$ the base current is positive. Also note that for a shorted base-emitter, the collector current increases with the collector-emitter voltage, but neither hysteresis nor an "on" state are observed. Finally, note that the data shown in FIG. 3 was obtained by driving the base by a voltage source, and thus does not represent the base-current-driven mode of operation of the device shown in FIG. 2.

Figure 2:
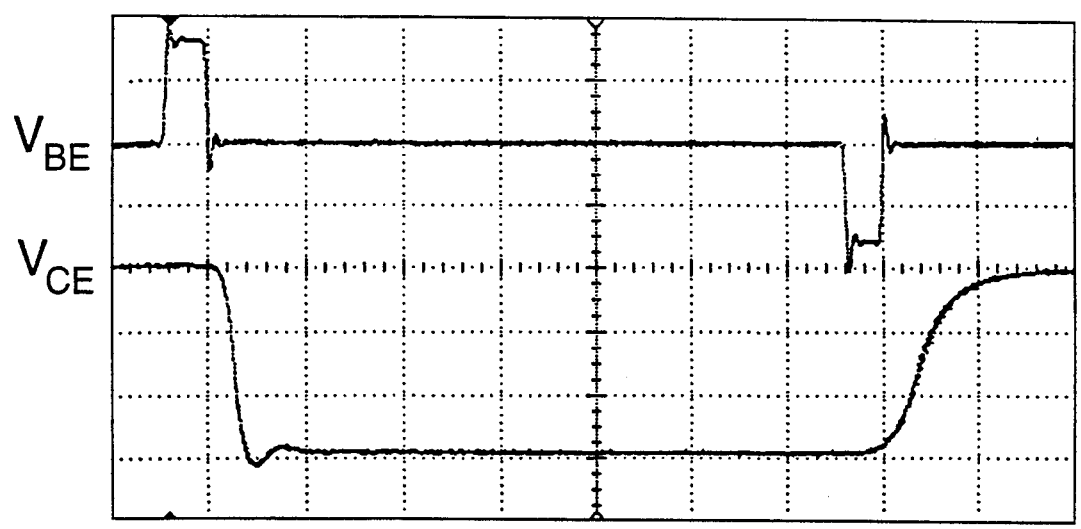
FIG. 2 is a graph on which base to emitter voltage ("$V_{BE}$"—top trace) and collector to emitter voltage ("$V_{CE}$"—bottom trace) are plotted versus time for the transistor of FIG. 1 operating in the pulsed mode with a collector supply voltage of 8.5 volts. The voltage (ordinate) scale is 1 volt per division and the time (abscissa) scale is 200 nanoseconds per division.
Figure 3:
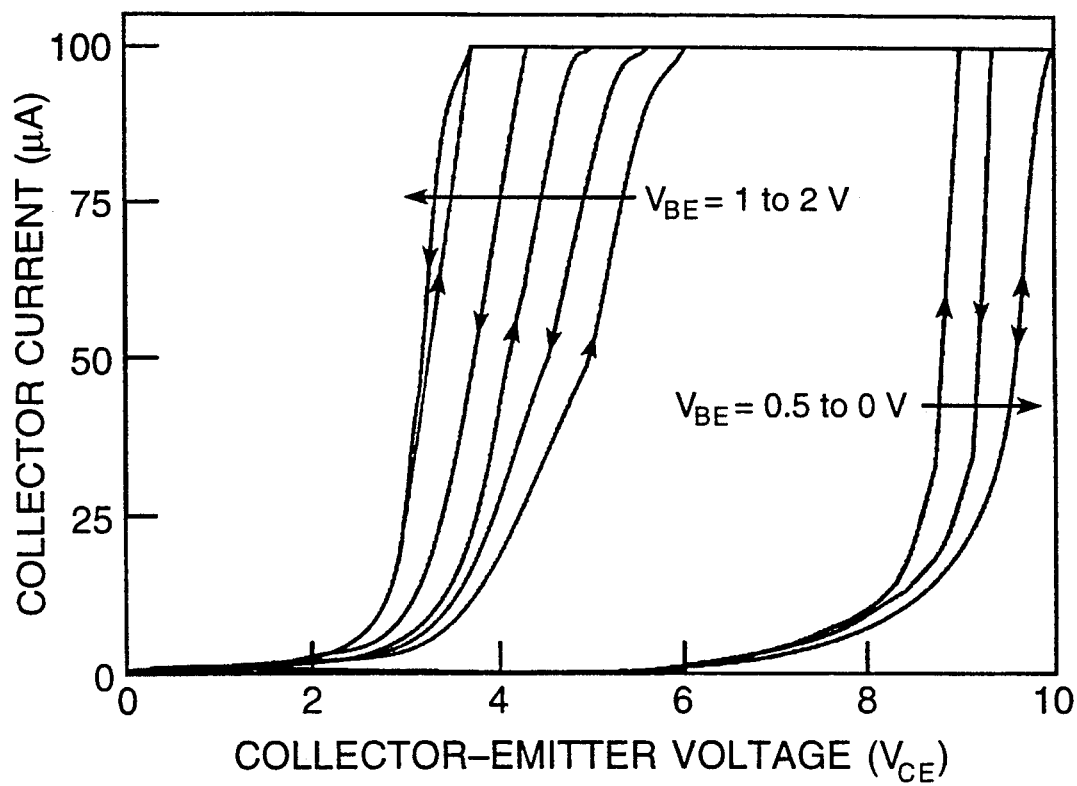
FIG. 3 depicts typical quasi-static collectoremitter I-V characteristics of the transistor of FIG. 1 for base to emitter voltages ($V_{BE}$) of 0 volts to 2.0 volts in 0.5 volt steps, with a semiconductor parameter analyzer current limit of 100 µA.

The results shown in FIGS. 2 and 3 demonstrate that a p-n junction is essential for obtaining stable reversible switching operation of the structure. It is also believed that the nature of the a—Si immediately underneath the collector contact is important. The results reported above were achieved with a nominally-undoped a—Si layer, but, in reality, some p-type doping directly under the collector contact can be expected from aluminum diffusion during the ohmic contact sintering step. It is significant that similar results to those reported above were achieved when a shallow boron implantation ($3.1 \times 10^{14}$ions/cm² at 20 keV) was performed prior to the collector metallization, but that no switching behaviour could be induced when a phosphorus implantation was performed ($1.9 \times 10^{15}$ions/cm² at 30 keV). Thus, the effective structure of transistor 10 is probably $(p^+ - i)_{a-Si} - (p-n)_{c-Si}$.

The Al/a—Si contact is forward biased. It is believed that this leads to strong injection of holes into the a—Si, as has been reported for the case of Al on near-intrinsic a—Si: Anderson, et al "Metal-semiconductor Contacts on Hydrogenated Amorphous Silicon Films", Phil. Mag. B 54, p. 317 (1986). Although not wishing to be bound by any theory, the inventors speculate that in the "off" state the heterojunction is reverse-biased with a large portion of the collector supply voltage being dropped across the undoped a—Si layer because of its high resistance. When the c—Si p-n junction is pulsed into forward bias, electrons are injected into the base and, upon reaching the a—Si/c—Si heterojunction, enter the a—Si layer. The injected electrons fill up the traps in the thin a—Si layer and, for high enough values of $V_{CE}$, reach the forward-biased Al/a—Si junction at the collector contact. There they reduce the positive space charge created by the trapping of the holes injected from the metal/a—Si contact, thus allowing many more holes to be injected into the a—Si layer. The holes injected from the Al/a—Si contact traverse the thin layer of a—Si, reach the base, and cause more electrons to be injected from the emitter to recombine with them. Therefore, forward-bias conditions are reinforced at the c—Si p-n junction, thus maintaining the electron supply from the emitter.

It is possible that the hole supply from the collector is sufficient to meet the recombination requirements in the base, and that any excess hole charge flows into the base lead, giving the negative base current which is observed in the above quasi-static measurements for values of $V_{BE}$ less than 0.75 volts. This is consistent with above-described persistence of the negative base current in the "on" holding state, when the base-emitter junction was measured to be only slightly forward-biased (0.4 to 0.5 volts). The "off" state is achieved by removal of the excess carriers from the base upon applying a negative current pulse to the base-emitter junction. Since the c—Si (p-n) junction is now cut off, the supply of electrons from the emitter is halted and the excess carriers in the a—Si layer are removed through diffusion and recombination. The latter is probably a dominant process because of the high recombination rate in a—Si, and is presumably the reason for the observed short turn-off time.

It can thus be seen that the invention provides stable switching operation of an a—Si/c—Si (p-n) heterojunction transistor. The switching effects are easily controlled by the magnitude of the current pulses applied to the base and by the dc collector supply voltage. Having regard to the measured short switching times, the small size of the device, the compatibility with a standard bipolar fabrication process, and the convenient three-terminal operation, these a—Si/c—Si heterostructures may be useful as basic memory cells.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A memory device comprising a single heterojunction bipolar transistor reversibly switchable between stable first and second states, said transistor comprising:

(a) a crystalline silicon substrate;
(b) a base region in said substrate;
(c) an emitter region in said substrate;
(d) an undoped amorphous silicon collector region formed on said substrate;
(e) a p-n junction formed in said substrate beneath said collector region; and,
(f) collector supply voltage means for applying a voltage of about 8 volts to about 10 volts to said collector.

2. A memory device as defined in claim 1, further comprising pulse switching means for selectively applying positive or negative voltage pulses to said base, to switch said device between said first and second states respectively.

3. A memory device as defined in claim 2, wherein said positive voltage pulses have a magnitude greater than about 0.75 volts, and said negative voltage pulses have a magnitude less than about −0.75 volts.

4. A memory device as defined in claim 3, wherein said first state is characterized by very low electrical current conductivity between said emitter and said collector; and, said second state is characterized by high electrical current conductivity between said emitter and said collector.

* * * * *